(12) United States Patent
Jeong et al.

(10) Patent No.: US 10,141,940 B2
(45) Date of Patent: Nov. 27, 2018

(54) FORWARDED CLOCK RECEIVER BASED ON DELAY-LOCKED LOOP

(71) Applicant: SEOUL NATIONAL UNIVERSITY R&DB FOUNDATION, Seoul (KR)

(72) Inventors: Deogkyoon Jeong, Seoul (KR); Woorham Bae, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 45 days.

(21) Appl. No.: 15/501,199

(22) PCT Filed: Jul. 8, 2015

(86) PCT No.: PCT/KR2015/007049
§ 371 (c)(1),
(2) Date: Feb. 2, 2017

(87) PCT Pub. No.: WO2016/021840
PCT Pub. Date: Feb. 11, 2016

(65) Prior Publication Data
US 2017/0230052 A1    Aug. 10, 2017

(30) Foreign Application Priority Data
Aug. 4, 2014   (KR) .................. 10-2014-0099835

(51) Int. Cl.
*H03L 7/091*    (2006.01)
*H03L 7/089*    (2006.01)
(Continued)

(52) U.S. Cl.
CPC ............ *H03L 7/0891* (2013.01); *H03L 7/081* (2013.01); *H03L 7/091* (2013.01); *H03K 19/21* (2013.01)

(58) Field of Classification Search
CPC .......... H03L 7/093; H03L 7/089; H03L 7/091
See application file for complete search history.

(56) References Cited

U.S. PATENT DOCUMENTS 6,166,572 A    12/2000  Yamaoka
9,035,684 B2 *  5/2015  Jung ..................... H03L 7/0802
                                                    327/149
(Continued)

FOREIGN PATENT DOCUMENTS

WO    WO 2005/122460 A1    12/2005

*Primary Examiner* — Hai L Nguyen
(74) *Attorney, Agent, or Firm* — Rabin & Berdo, P.C.

(57) ABSTRACT

A delay-locked loop includes a voltage control delay line and a phase detector. The phase detector includes: a sampler unit generating multiple samples obtained by sampling a data signal in a time interval corresponding to a half of a unit interval based on a clock; a mode selection unit selecting a series of samples among the multiple samples in such a way that the mode selection unit selects the series of samples starting from an odd-numbered sample, or selects the series of samples starting from an even-numbered sample, according to a mode selection signal; and an XOR unit performing an XOR operation on the samples that are adjacent to each other and outputting an operation result, the output operation result is used for controlling the voltage-controlled delay line. The delay-locked loop can greatly reduce power consumption and an area of the voltage control delay line.

18 Claims, 11 Drawing Sheets

(51) Int. Cl.
 *H03L 7/081* (2006.01)
 *H03K 19/21* (2006.01)

(56) References Cited

U.S. PATENT DOCUMENTS

| | | | |
|---|---|---|---|
| 9,680,481 B2 * | 6/2017 | Tsunoda | H03L 7/0807 |
| 9,831,861 B2 * | 11/2017 | Nedovic | H03K 5/1534 |
| 2003/0118209 A1 | 6/2003 | Cohen et al. | |
| 2007/0058768 A1 | 3/2007 | Werner | |
| 2008/0273430 A1 | 11/2008 | Serrano et al. | |

* cited by examiner

FORWARDED CLOCK RECEIVER BASED ON DELAY-LOCKED LOOP

TECHNICAL FIELD

The present invention relates to a forwarded clock receiver based on a delay-locked loop. More particularly, the present invention relates to a forwarded clock receiver based on a delay-locked loop, the clock receiver having improved jitter tolerance characteristics, and low power consumption, and small area requirements, and low noise generation.

BACKGROUND ART

Recently, as large-sized contents including ultra high definition (UHD) and 3D displays have become more widespread, there is a continuous request for increasing the bandwidth of wireline communications. In addition, miniaturization of semiconductor devices constantly improves computing performance of integrated circuits, thus the demand for increasing the bandwidth in wireline communications has rapidly increased.

However, due to the physical limitations of copper lines through which data transmission is performed, there is a limit for increasing the bandwidth in wireline communications using a single copper channel. Therefore, recently, there has developed a method of obtaining a high bandwidth by transmitting high speed data in parallel by using several channels.

Meanwhile, as mobile devices such as smartphones, tablet pcs, etc. are provided, there is a request for minimizing power consumption and increasing computing performance. Since power consumption directly effects battery duration time and heat of mobile devices, in integrated circuit design, designs that focus on minimizing power consumption are actively being sought by industries and institutes.

Finally, the biggest goal is to obtain a high bandwidth by transmitting data in parallel while minimizing power consumption.

A method of transmitting and receiving data by a wireline communication is classified into two types. The first one is a forwarded clock method that transmits data and a clock including timing information of the data. The forwarded clock method has excellent noise characteristics since the method is based on exact timing information obtained from the received clock. The second one is an embedded clock method that only transmits data without a clock.

There are disadvantages for the forwarded clock method in terms of power consumption and price since the method requires an additional clock channel. Thus, the embedded clock method is preferred for the conventional wireline transceiver that does not require a high bandwidth. However, recently, in a parallel forwarded data structure that satisfies the requirement of the high bandwidth, a single clock channel is additionally used for multiple data channels, thus it is possible to distribute power consumption and price that are increased due to the clock channel. Accordingly, an attempt has been made to approach a structure that can take advantage of the forwarded clock method.

A wireline communication receiver functions to recover a received signal that is deformed and distorted by several external factors while passing a copper channel to an accurate signal such that the received signal is used by an integrated circuit without error. Herein, it is the core of technology to sample the received signal at the timing where data is not mostly distorted. It is generally known that sampling at the center of the data has the best performance.

For this, a method of removing timing skew that is generated between the data and the clock is used.

A structure that is the most widely used receiver is based on a voltage-controlled oscillator (VCO). In the above structure, each of data lanes needs a self-generated clock generated from the voltage-controlled oscillator, thus the structure is a very advantageous for the receiver using the embedded clock method that includes a single data channel. In addition, it is easy to design one receiver and then expand it to several since each of data channels are independently operated. Thus, the structure is widely used for a receiver with a parallel structure including multiple data channels due to an easy design thereof.

However, in the parallel structure, the receiver includes multiple voltage-controlled oscillators. The use of multiple voltage-controlled oscillators consumes large amounts of power and require a large area, thus it is very disadvantageous in terms of cost competitiveness and power consumption. In addition, interference (injection locking/pulling) between the oscillators degrades performance of the receiver and operation thereof cannot be guaranteed in severe cases.

In an effort to solve the above problems, in the parallel structure, a structure using a circuit based on a phase interpolator is used. The above structure uses a single voltage-controlled oscillator, or uses a delay-locked loop (DLL) without using the voltage-controlled oscillator and recovers data and a clock by additionally using the phase interpolator circuit. In the above structure, there is no interference generated between the voltage-controlled oscillators, but the phase interpolator circuit consumes large power and is difficult to design, thus the structure is very disadvantageous in terms of cost competitiveness and design time.

Meanwhile, jitter tolerance is the most important performance indicator to show the operating performance of the receiver. Herein, jitter is an indicator showing noise on a time axis. In the conventional receiver based on an oscillator, a frequency range of jitter tolerance is limited, or the range may greatly vary due to an unpredictable level depending on the situation. Thus, it is a big problem in designing a receiver having excellent jitter tolerance characteristics.

The above-mentioned problems in the conventional technology and the awareness of the challenges related thereto are not obviously known to the persons who skilled in the art of the present invention. Therefore, the present invention shall not be deemed to be obvious based on this awareness.

DISCLOSURE

Technical Problem

An object of the present invention is to provide a delay-locked loop capable of reducing power consumption, a forwarded clock receiver based on the delay-locked loop, and a method of operating a phase detector used for the delay-locked loop.

Another object of the present invention is to provide a delay-locked loop capable of reducing the size of an occupying area, a forwarded clock receiver based on the delay-locked loop, and a method of operating a phase detector used for the delay-locked loop.

Another object of the present invention is to provide a delay-locked loop capable of improving jitter tolerance, a forwarded clock receiver based on the delay-locked loop, and a method of operating a phase detector used for the delay-locked loop.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

According to one aspect of an embodiment of the present invention, there is provided a delay-locked loop including: a voltage-controlled delay line and a phase detector, wherein the phase detector: generates a first sample group obtained by sampling a data signal in at least two positions by a unit interval based on a clock and a second sample group obtained by sampling the data signal in at least two positions by the unit interval based on the clock, the second sample group being generated by sampling at positions where a half of the unit interval is different from the unit interval of the first sample group; includes a first mode that controls the voltage-controlled delay line by selecting the first sample group as an edge sample of the data signal and by selecting the second sample group as a data sample of the data signal, and a second mode that controls the voltage-controlled delay line by selecting the first sample group as the data sample of the data signal and by selecting the second sample group as the edge sample of the data signal; and operates by toggling between the first mode and the second mode.

According to another aspect of an embodiment of the present invention, there is provided a delay-locked loop including: a voltage-controlled delay line and a phase detector, wherein the phase detector: generates a sample group including multiple samples that are obtained by sampling a data signal in a time interval corresponding to a half of a unit interval based on a clock; includes a first mode that controls the voltage-controlled delay line by selecting an odd-numbered sample among the multiple samples as an edge sample of the data signal and by selecting an even-numbered sample among the multiple samples as a data sample of the data signal, and a second mode that controls the voltage-controlled delay line by selecting the odd-numbered sample among the multiple samples as the data sample of the data signal and by selecting the even-numbered sample among the multiple samples as the edge sample of the data signal; and operates by toggling between the first mode and the second mode.

According to the delay-locked loop according to one aspect of the present invention, the edge sample and the data sample that are adjacent to each other may be used for controlling the voltage-controlled delay line by being performed an XOR operation thereon.

According to the delay-locked loop according to one aspect of the present invention, when a preset delay time exceeds a low limit while decreasing a delay of the voltage-controlled delay line, or when the preset delay time exceeds a high limit while increasing a delay of the voltage-controlled delay line, the phase detector may toggle between the first mode and the second mode.

According to another aspect of an embodiment of the present invention, there is provided a delay-locked loop including: a voltage-controlled delay line and a phase detector, wherein the phase detector includes: a sampler unit generating multiple samples obtained by sampling a data signal in a time interval corresponding to a half of a unit interval based on a clock; a mode selection unit selecting a series of samples among the multiple samples generated from the sampler unit in such a way that the mode selection unit selects the series of samples that start from an odd-numbered sample, or selecting the series of samples that start from an even-numbered sample, according to a mode selection signal; and an XOR unit performing an XOR operation on the samples among the series of samples that are adjacent to each other and outputting an operation result, wherein the output operation result of the XOR unit is used for controlling the voltage-controlled delay line.

According to the delay-locked loop according to one aspect of the present invention, the phase detector may further include: a struck detector toggling the mode selection signal when a control voltage for the voltage-controlled delay line exceeds a high limit while increasing the control voltage, or when the control voltage exceeds a low limit while decreasing the control voltage.

According to the delay-locked loop according to one aspect of the present invention, the delay-locked loop may further include: a pair of charge pumps increasing or decreasing a control voltage of the voltage-controlled delay line by using the output result of the XOR unit; and a loop filter filtering the control voltage.

According to the delay-locked loop according to one aspect of the present invention, the delay-locked loop may further include: a quadrature phase clock generator generating a second clock signal that is delayed by 90 degrees from a first clock signal output from the voltage-controlled delay line and providing the second clock signal to the sampler unit so as to be used for generating the samples.

According to the delay-locked loop according to one aspect of the present invention, the quadrature phase clock generator may include: a second voltage-controlled delay line generating the second clock signal by delaying the first clock signal; a voltage increasing charge pump supplying a current that increases a control voltage that controls a delay of the second voltage-controlled delay line; a voltage decreasing charge pump supplying a current that decreases the control voltage; and a second phase detector controlling the voltage increasing charge pump and the voltage decreasing charge pump.

According to the delay-locked loop according to one aspect of the present invention, the second phase detector may control the voltage decreasing charge pump by using a second division signal that is obtained by dividing the second clock signal, and control the voltage increasing charge pump by using a signal obtained by performing an XOR operation on the second division signal and a first division signal that is obtained by dividing the first clock signal A forwarded clock receiver including the delay-locked loop, wherein a received clock signal is input to the voltage-controlled delay line.

According to another aspect of an embodiment of the present invention, there is provided a quadrature phase clock generator, the generator including: a voltage-controlled delay line generating a second clock signal that is generated by delaying an input first clock signal; a voltage increasing charge pump supplying a current that increases a control voltage that controls a delay of the voltage-controlled delay line; a voltage decreasing charge pump supplying a current that decreases the control voltage; and a phase detector controlling the voltage increasing charge pump and the voltage decreasing charge pump, wherein the phase detector controls: the voltage decreasing charge pump by using a second division signal that is obtained by dividing the second clock signal, and the voltage increasing charge pump by using a signal obtained by performing an NOR operation on the second division signal and a first division signal that is obtained by dividing the first clock signal.

According to the quadrature phase clock generator, a ratio between a current supply capacity of the voltage increasing charge pump and a current supply capacity of the voltage decreasing charge pump may be set to 4:5.

According to another aspect of an embodiment of the present invention, there is provided a method of operating a phase detector, whereby the phase detector is used in a delay-locked loop, the method including:

a first step of generating multiple samples by sampling a data signal in a time interval corresponding to a half of a unit interval based on a clock; a second step of selecting a series of samples among the multiple samples generated at the first step, by selecting the series of samples that start from an odd-numbered sample, or by selecting the series of samples that start from an even-numbered sample, according to a mode selection signal; and a third step of performing an XOR operation on adjacent samples among the series of samples that are output from the second step, and outputting an operation result; wherein the output operation result of the third step is used for controlling the voltage-controlled delay line of the delay-locked loop.

According to the method of operating the phase detector, the mode selection signal may be toggled when a control voltage for the voltage-controlled delay line exceeds a high limit while increasing the control voltage, or when the control voltage exceeds a low limit while decreasing the control voltage.

Advantageous Effects

According to one aspect of the present invention, in the delay-locked loop or the forwarded clock receiver based on the delay-locked loop, a stuck state is solved and even though a point at which a phase difference becomes 0 degrees is not included by a variable range of a delay time being 0.5 UI, the above-mentioned problem is solved by using a method of data-edge switching (mode switching). According to one aspect of the present invention, a stuck locking problem is fundamentally solved, and a delay time range that is conventionally required is decreased by half.

According to another aspect of the present invention, in the delay-locked loop or the forwarded clock receiver based on the delay-locked loop, the stuck locking is solved since the delay-locked loop performs a locking operation through switching between data-edge samples even though the present invention uses the voltage-controlled delay line that provides a delay time less than 1 UI, in particular, a delay time of about 0.5 UI.

According to another aspect of the present invention, in the delay-locked loop or the forwarded clock receiver based on the delayed-locked loop, power consumption and an occupying area of the voltage-controlled delay line that consumes large power and occupies a large area within a chip are reduced. In particular, when the delay-locked loop is used for the parallel forwarded data structure that transmits data in parallel by using multiple channels, the above advantages of power consumption and occupying area are further enhanced.

According to another aspect of the present invention, the receiver may be designed to consume low power while using the delay-locked loop and without using an oscillator, thus the receiver has improved jitter tolerance.

DESCRIPTION OF DRAWINGS

In FIG. 5(a), there is no phase difference between a clock signal and a data signal. In FIG. 5(b), the clock signal is faster than the data signal. In FIG. 5(c), the data signal is faster than the clock signal.

FIG. 7(a) shows clock signals and a data signal, sampling timings, signals do and up that are generated by performing XOR operations on the sampled signals, and FIG. 7(b) is a view conceptually showing a mode switching.

BEST MODE

Figure 1:
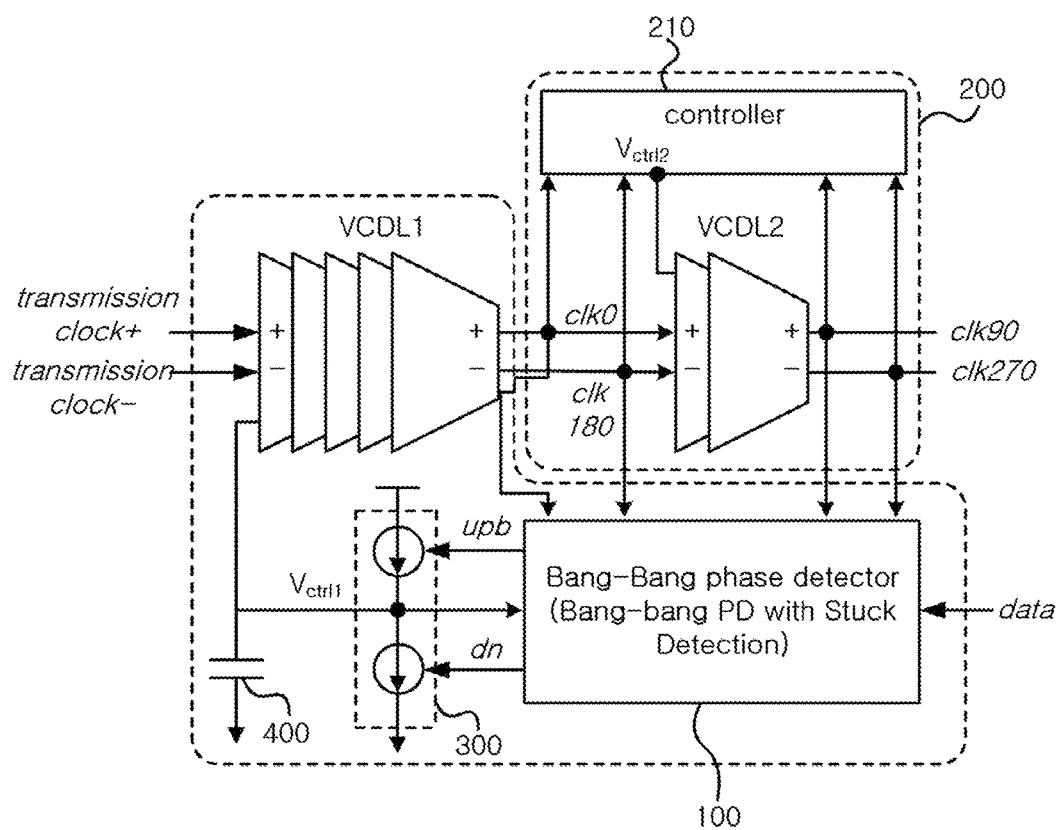
FIG. 1 is a view showing a system for a forwarded clock receiver based on a delay-locked loop according to an embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

FIG. 1 is a view showing a system for a forwarded clock receiver based on a delay-locked loop according to an embodiment of the present invention.

The system for the forwarded clock receiver based on the delay-locked loop according to the embodiment of the present invention may be configured to include: a first voltage-controlled delay line VCDL1; a quadrature phase clock generator 200 including a second voltage-controlled delay line VCDL2; a Bang-Bang phase detector 100 including a stuck detector; a charge pumping unit 300; and a loop filter 400. The forwarded clock receiver according to the embodiment of the present invention includes a delayed-locked loop (DLL) and is operated based thereon.

The first voltage-controlled delay line VCDL1 outputs a differential clock signal (clk0, clk180) by delaying the differential clock signal (transmission clock +, transmission clock −) that is transmitted and received from a transceiver. The voltage-controlled delay line is well-known in the art, so a detailed description thereof will be omitted.

The first voltage-controlled delay line VCDL1 controls a delay time of the differential clock signal by using a control voltage $V_{ctrl1}$ that is applied to the first voltage-controlled delay line VCDL1. Herein, in the embodiment of the present invention, a period of the clock signal (hereinafter, also referred to a clock) is double than that of a period of a data signal (hereinafter, also referred to data). However, it is not limited thereto, and various embodiments such as using the two signals having the same period may be also used.

The quadrature phase clock generator 200 generates a clock signal that is delayed by 90 degrees from the clock signal output from the first voltage-controlled delay line VCDL1 and provides the delayed clock signal to a sampler unit 220 of the Bang-Bang phase detector 100 that will be described later so as to be used for sampling the data signal.

The clock signal that is delayed by the first voltage-controlled delay line VCDL1 is delayed again by 90 degrees by passing a second voltage-controlled delay line VCDL2 to have a corresponding delay time, thus differential clock signals clk90 and clk270 corresponding a phase of 90 degrees are obtained. Herein, a controller 210 of the quadrature phase clock generator 200 controls the delay time of the second voltage-controlled delay line VCDL2 by comparing phases of clock signals clk0, clk90, clk180 and clk270.

By using clock signals having four phases 0°, 90°, 180° and 270°, the Bang-Bang phase detector 100 (hereinafter, also referred to a phase detector) obtains recovered data signal and edge information by sampling received data signal. The recovered data signal and the edge information are used for controlling the first voltage-controlled delay line VCDL1 such that a phase between the received data signal and the clock signal becomes the optimal value. Thus, the data signal is recovered without errors by the receiver.

The Bang-Bang phase detector 100 uses the first voltage-controlled delay line VCDL1 and the clock signal provided from the quadrature phase clock generator 200 and outputs signals do and upb to the charge pumping unit 300 for controlling the control voltage $V_{ctrl1}$ of the first voltage-controlled delay line VCDL1.

The charge pumping unit 300 includes a pair of charge pumps, increases or decreases the control voltage $V_{ctrl1}$ that controls the first voltage-controlled delay line VCDL1, and increases or decreases the control voltage $V_{ctrl1}$ by using an output of an XOR unit 140 of the phase detector 100 that will be described later.

The loop filter 400 may filter the control voltage $V_{ctrl1}$ and be configured with a capacitor as shown in FIG. 1.

Figure 2:
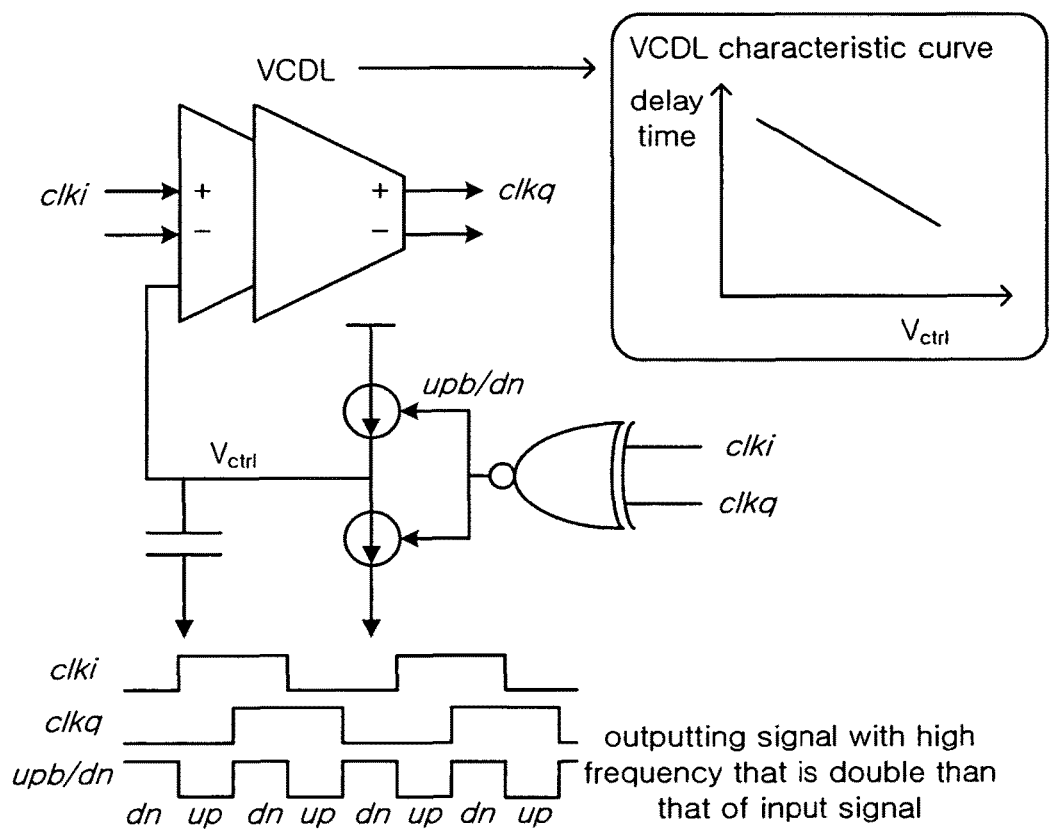
FIG. 2 is a view showing a quadrature phase clock generator based on a conventional delay-locked loop using a XOR gate, and operational waves and a VCDL characteristic curve thereof.

FIG. 2 is a view showing a quadrature phase clock generator based on a conventional delay-locked loop using a XOR gate, and operational waves and a VCDL characteristic curve thereof.

A voltage-controlled delay line VCDL delays an input differential clock signal clki by a delay time controlled by a control voltage $V_{ctrl1}$ and outputs the delayed differential clock signal clkq.

Generally, the control voltage $V_{ctrl1}$ and the delay time of the voltage-controlled delay line VCDL has the characteristic curve shown in a right part of FIG. 2. In the conventional quadrature phase clock generator, in order to generate a 90° clock signal clkq by delaying a 0° clock signal clki, the voltage-controlled delay line performs an XOR operation on the two clock signals clki and clkq. When a result of the XOR operation is 1, the control voltage $V_{ctrl1}$ is decreased. Alternatively, when the result of the XOR operation is 0, the control voltage $V_{ctrl1}$ is increased such that the delay time is controlled to have a 90° phase.

As shown in the operational waves of FIG. 2, when an XOR gate is used for the phase detector and the delay-locked loop is locked in a delay time of 90° phase, then the XOR gate outputs upb and do of the XOR gate has a frequency that is double than the input clock signal clki.

However, in case of high-speed interface circuits, the interface circuits are designed to output a clock signal having the fastest possible frequency within the chip to speed up an operational bit rate thereof. When a signal having the above doubled frequency is present within the chip, for example, the conventional quadrature phase clock generator, the clock frequency has to be decreased by half considering such a signal having the doubled frequency. Accordingly, the operational bit rate of the overall system is decreased by half due to the signal having the doubled frequency. In addition, when a duty-cycle error is present in the received clock signal, the duty-cycle error is reflected in the output of the XOR gate, thus unwanted phase distortion may occur due to the duty-cycle error.

The conventional quadrature phase clock generator shown in FIG. 2 may be used for a forwarded clock receiver based on a delay-locked loop of the present invention, but in the embodiment of the present invention, an advanced quadrature phase clock generator whereby the above drawbacks are overcome may be used.

Figure 3:
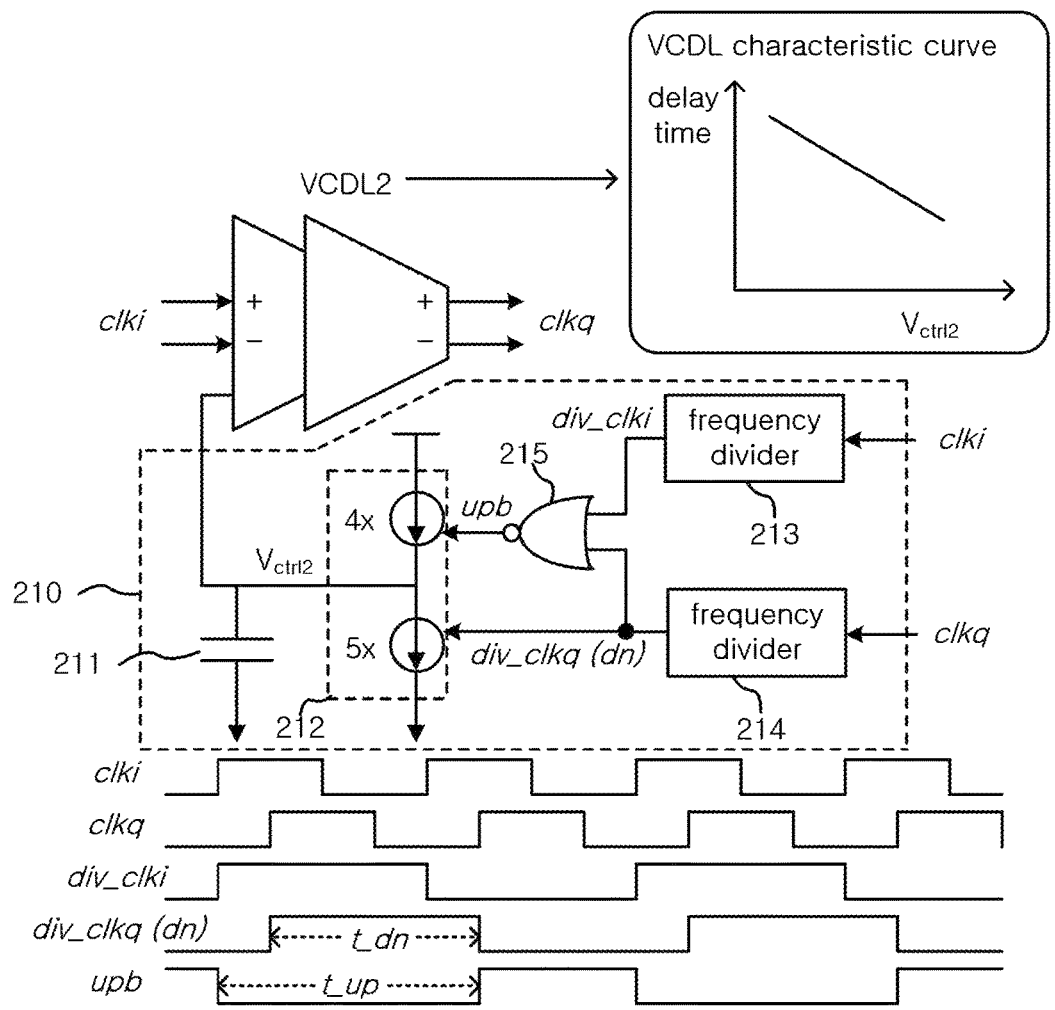
FIG. 3 is a view showing a quadrature phase clock generator 200 based on a delay-locked loop 200 according to an embodiment of the present invention, and operational waves and a VCDL characteristic curve thereof.

FIG. 3 is a view showing a quadrature phase clock generator based on a delay-locked loop according to an embodiment of the present invention, and operational waves and a VCDL characteristic curve thereof.

The quadrature phase clock generator 200 according to the embodiment of the present invention may be configured to include: a second voltage-controlled delay line VCDL2; a first frequency divider 213; a second frequency divider 214; an NOR gate 215; a charge pumping unit 212; and a controller including a loop filter 211. The first and second frequency dividers 213 and 214, and the NOR gate configures a linear phase detector.

The second voltage-controlled delay line VCDL2 delays an input differential clock signal clki by a delay time that is controlled by a control voltage $V_{ctrl2}$, and outputs the delayed differential clock signal clkq. The control voltage $V_{ctrl2}$ and the corresponding delay time of the second voltage-controlled delay line VCDL2 have the VCDL characteristic curve shown in a right part of FIG. 3. Herein, the clock signal clki and the clock signal clkq may be identical to the clock signal clk0 and the clock signal clk90 of FIG. 1.

A basic operational principle of the quadrature phase clock generator 200 is to obtain the 90° clock signal clkq by delaying the 0° clock signal clki. The controller 210 controls the second voltage-controlled delay line VCDL2 such that the delay time has a phase of 90°.

The charge pumping unit 212 includes a voltage increasing charge pump and includes a voltage decreasing charge pump, the voltage increasing charge pump supplies current that increases the control voltage $V_{ctrl2}$ controlling the second voltage-controlled delay line VCDL2, and the voltage decreasing charge pump supplies current that decreases the control voltage $V_{ctrl2}$ controlling the second voltage-controlled delay line VCDL2. In addition, the phase detector is configured to include the first frequency divider 213, the second frequency divider 214, and the NOR gate, and controls the voltage increasing charge pump and the voltage decreasing charge pump.

The phase detector controls the voltage decreasing charge pump by using a second division signal div_clkq (or dn) that is divided from the output clock signal clkq, and controls the voltage increasing charge pump by using a signal that is obtained by performing a NOR operation, by the NOR gate 215, on the second division signal div_clkq (or dn) and a first division signal div_clki that is divided from the input clock signal clki.

A method of operating of the quadrature phase clock generator 200 is described in detail. First, the clock signals clki and clkq are divided by the first frequency divider 213 and the second frequency divider 214. The first and second frequency dividers decrease a bandwidth required from the phase detector and prevents unwanted phase distortion by removing a duty-cycle error.

Herein, a time t_dn refers to a time in which the second division signal div_clkq (or dn) divided from the clock signal clkq is "high", and indicates a phase degree between the clocks signals clki and clkq that is less than a desired 90°. A time t_up refers to a time in which a signal upb that is obtained by performing a NOR operation on the divided clock signal clkq and the clock signal clki is "low", and indicates that a phase difference is greater than 90°.

When the phase difference between the clocks signals clki and clkq is exactly 90 degrees, a ration between the time t_dn in which the signal do is high and the time t_up in which the signal upd is low is set to 4:5. A current supply capacity between a decreasing current and an increasing current of the charge pump is inversely set to 5:4 such that the quadrature phase clock generator generates a clock signal that is exactly delay by 90 degrees in such a condition. In other words, a ratio between a current supply capacity of the voltage increasing charge pump and a current supply capacity of the voltage decreasing charge pump is inversely set to 4:5.

In addition, as shown in the operational waves, in the quadrature phase clock generator according to the embodiment of the present invention, frequencies of all signals are identical to the clock frequency, or the all signals are operated in a low frequency by using the frequency dividers, thus speed limitation of the conventional quadrature phase clock generator shown in FIG. 2 operated based on the XOR gate is solved.

The quadrature phase clock generator according to the embodiment of the present invention may be operated in a frequency that is the same to a clock frequency of the overall system, and there is an effect of solving a conventional problem in which an operational speed of the overall system is decreased by half.

In addition, the quadrature phase clock generator according to the embodiment of the present invention uses the received clock signal by dividing it, thus there is an effect of not generating phase distortion even though a duty-cycle error is present in the received clock signal.

Figure 4:
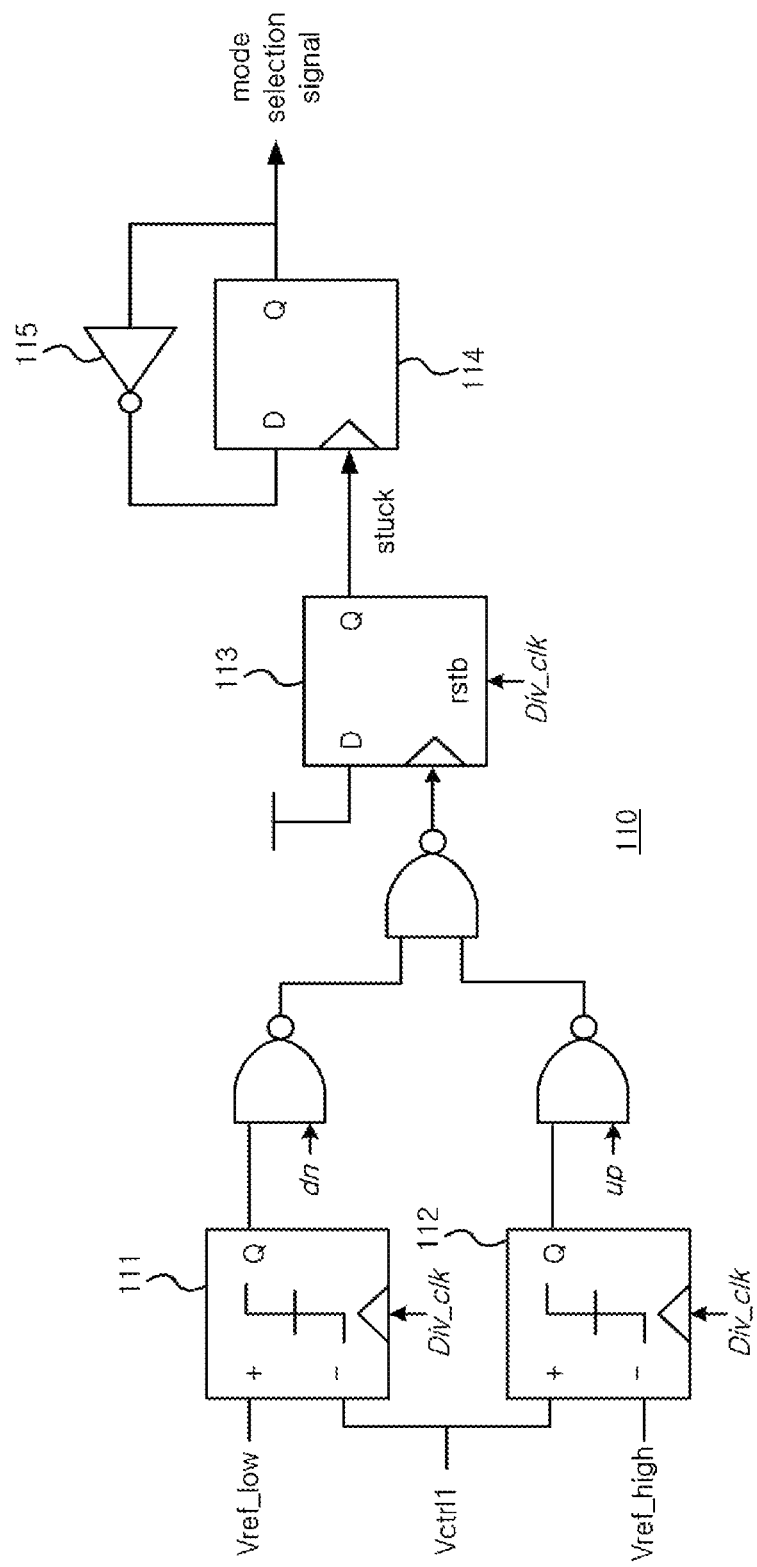
FIG. 4 is a view showing a circuit diagram of a stuck detector 210 that is integrated in a Bang-Bang phase detector 100 according to an embodiment of the present invention.

FIG. 4 is a view showing a circuit diagram of a stuck detector 210 that is integrated in a Bang-Bang phase detector 100 according to an embodiment of the present invention.

The stuck detector 210 provides a mode selection signal that controls the mode selection unit 130 of the phase detector 100 that will be described later. The stuck detector 210 toggles the "mode selection signal" when a control voltage $V_{ctrl1}$ exceeds a high limit $V_{ref\_high}$ while increasing the control voltage $V_{ctrl1}$ of the voltage-controlled delay line VCDL1, or when the control voltage $V_{ctrl1}$ exceeds a low limit $V_{ref\_low}$ while decreasing the control voltage $V_{ctrl1}$ of the first voltage-controlled delay line VCDL1.

A stuck locking occurs in the delay-locked loop when a control device transmits a command to speed up a delay where the delay can no longer be accelerated, or vice versa. In order to detect such a stuck locking, a signal that converts a struck signal from "low" to "high" is generated by detecting situations in which a signal up and a signal dn are respectively generated from the phase detector 100 by using the two comparators 111 and 112. The signal up and the signal dn are respectively generated when the control voltage $V_{ctrl1}$ of the first voltage-controlled delay line VCDL1 exceeds a preset high limit $V_{ref\_high}$ and when the control voltage $V_{ctrl1}$ of the first voltage-controlled delay line VCDL1 exceeds a preset low limit $V_{ref\_low}$. Herein, the signal up may be a signal obtained by performing an AND operation on signals up<1> and up<0> of signals up<1:0> shown in FIG. 8 that will be described later. The signal dn may be a signal obtained by performing an AND operation on signals dn<1> and dn<0> of signals dn<1:0> shown in FIG. 8 that will be described later, or may be one of the two signals. In addition, such an operation may be periodically repeated by using the divided clock signal div_clk.

A first D flip-flop 113 is reset every period of the divided clock signal Div_clk, but when the above stuck locking occurs, the first D flip-flop 113 generates a stuck signal that has an edge converting from 0 to 1. Whenever such a stuck signal is generated, the mode selection signal is toggled from 0 to 1, or from 1 to 0 by a second D flip-flop 144 and an inverter 15.

Figure 5:
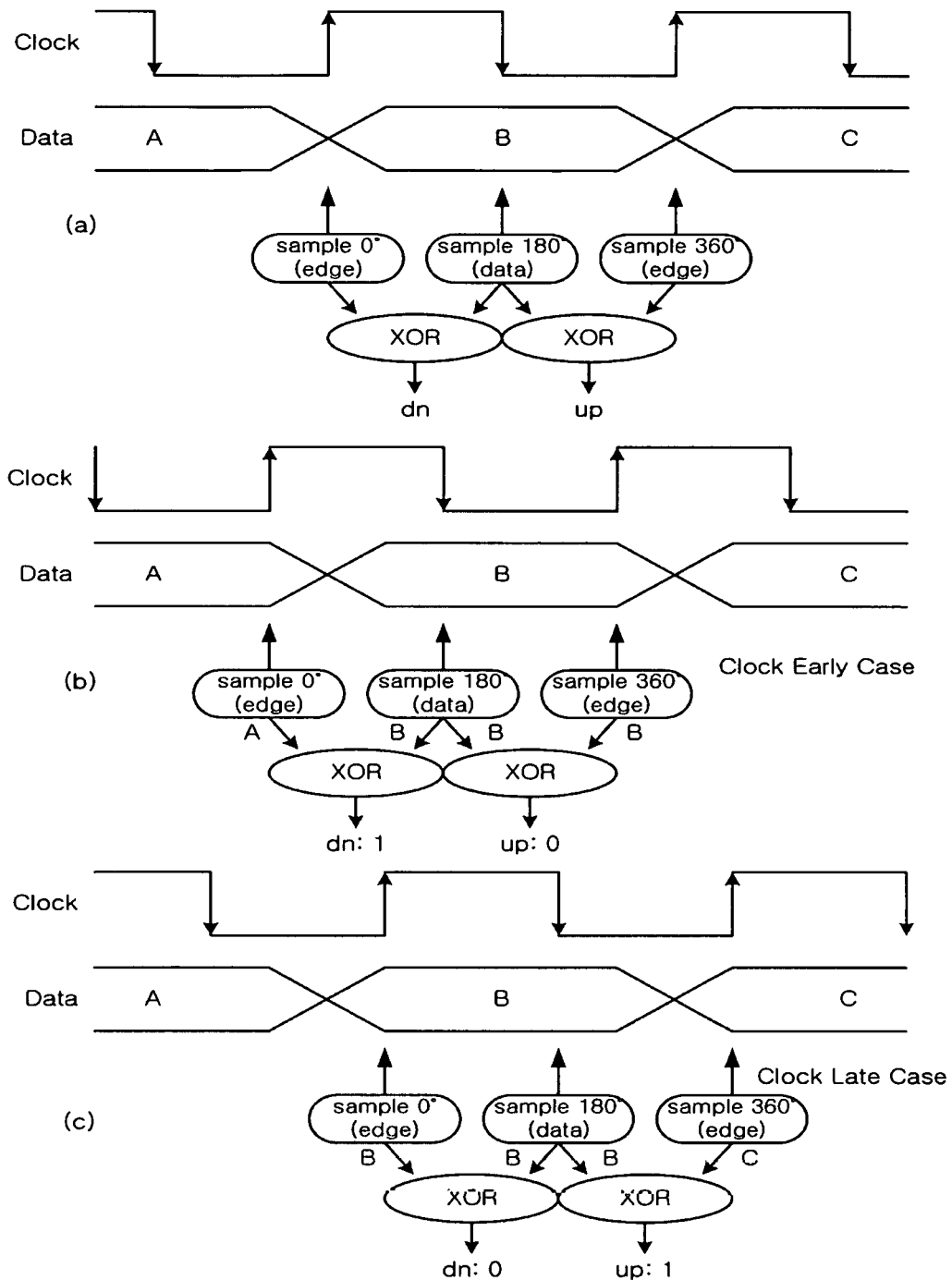
FIGS. 5(a) to 5(c) are views showing a conventional Bang-Bang phase detector.

FIGS. 5(a) to 5(c) are views showing a conventional Bang-Bang phase detector. In FIG. 5(a), there is no phase difference between a clock signal and a data signal. In FIG. 5(b), the clock signal is faster than the data signal. In FIG. 5(c), the data signal is faster than the clock signal.

FIGS. 5(a) to 5(c) shows clock signals and data signals, sampling timings, signals dn and up generated by performing an XOR operation on the sampled signals.

Conventionally, a Bang-Bang phase detector respectively samples a data signal in a rising edge and in a falling edge, and operates to match a rising edge of a clock signal with an edge of a data by using a sampling result. Thus, the data is sampled in the falling edge of the clock signal without a skew.

In the phase detector shown in FIGS. 5(a) to 5(c), the data is sampled in the rising edge and in the falling edge of the clock signal, samples sampled in the rising edge of the clock signal become edge samples, and samples sampled in the falling edge of the clock signal become data samples.

Herein, the edge samples and the data samples are identical in that the edge samples and the data samples are sampled from the data signal by using the clock signal. However, the edge samples are handled as samples that are obtained by sampling in edge areas or in nearby edge areas in which a transition occurs in the data signal, and the data samples are handled as samples that are obtained by sampling in areas between neighboring edges, or in middle areas of the data signal.

A conventional Bang-Bang phase detector, for a single data sample (sample 180°), compares values of the data sample of both edges thereof (sample 0°, sample 360°), detects a section in which a data value is transited, and issues a speed-up command up that speeds up a clock phase or a speed-down command do that speeds down the clock phase. Herein, the values of the data samples refer to data values that will be recovered.

As shown in FIG. 5(b), when the clock signal is faster than the data signal, a value obtained by performing an XOR operation on a first edge sample and a data sample becomes 1, a value obtained by performing an XOR operation on the data sample and a second edge sample becomes 0. Thus, a feedback that increases a delay time of the clock signal is performed by decreasing the control voltage of the voltage-controlled delay line.

As shown in FIG. 5(c), when the data signal is faster than the clock signal, a value obtained by performing an XOR operation on a first edge sample and a data sample becomes 0, a value obtained by performing an XOR operation on the data sample and a second edge sample becomes 1. Thus, a feedback that decreases a delay time of the clock signal is performed by increasing the control voltage of the voltage-controlled delay line.

Figure 6:
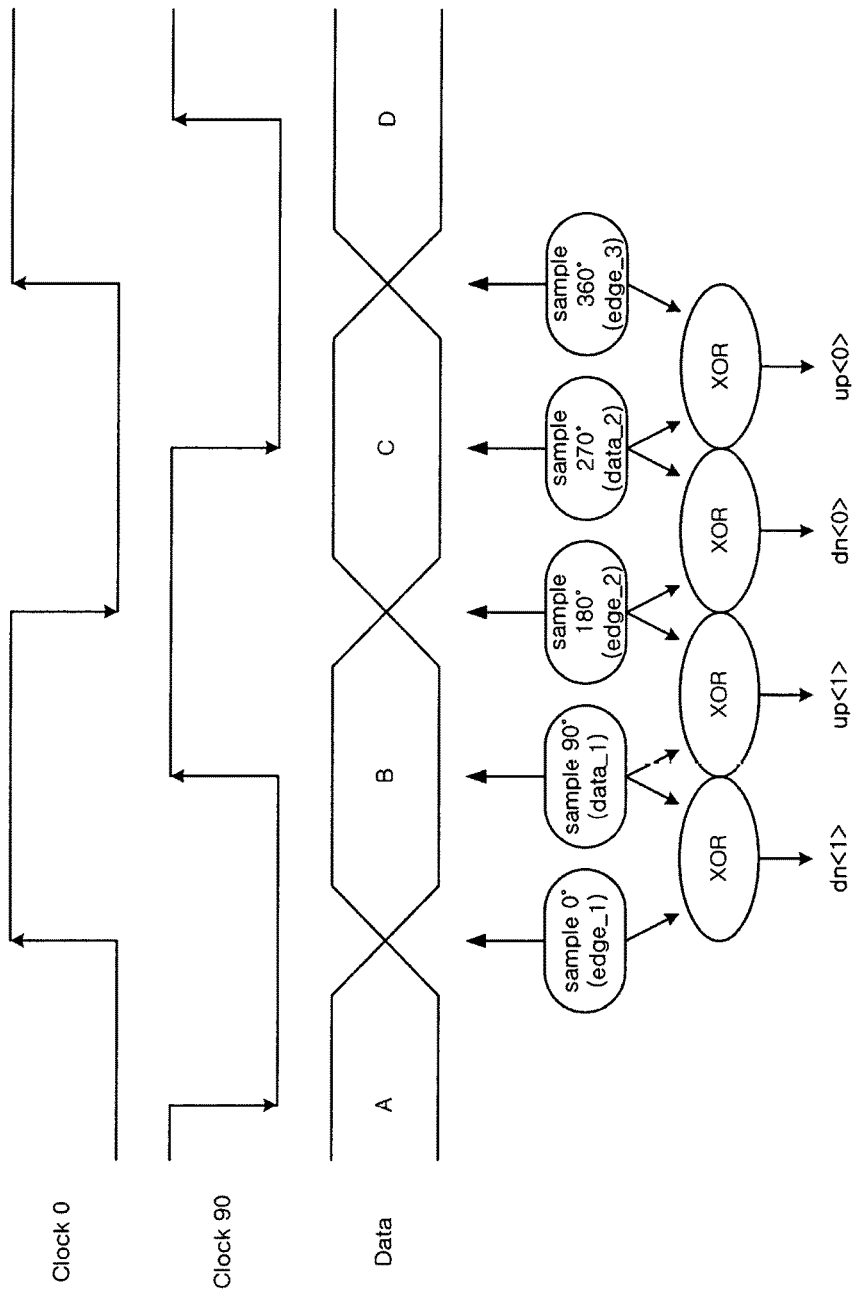
FIG. 6 is a view showing another conventional Bang-Bang phase detector, and shows a Bang-Bang phase detector having a half-rate structure in which a clock period is double than that of a data period.

FIG. 6 is a view showing another conventional Bang-Bang phase detector and shows a Bang-Bang phase detector having a half-rate structure in which a clock period is double than a data period.

In the Bang-Bang phase detector having the half-rate structure, a 90° clock signal Clock 90 is used to obtain both edge samples of a single data sample. Herein, data values obtained in a rising edge and in a falling edge of a 0° clock signal Clock 0 become edge samples sample 0° (or edge_1) and sample 180° (or edge_2), and data values obtained in a rising edge and in a falling edge of the 90° clock signal Clock 90 become data samples sample 90° (or data_1) and sample 270° (or data_2).

As the case of FIGS. 5(a) to 5(c), commands up and do are issued by performing XOR operations on values of the data sample and the edge sample. Herein, since all operations are performed at clock frequencies, XOR operations are performed on the edge samples of both sides of the data sample for two data samples when the half-rate structure in which the clock period is double than the data period is used. Therefore, the Bang-Bang phase detector generates signals up and dn respectively having 2 bits.

Figure 7:
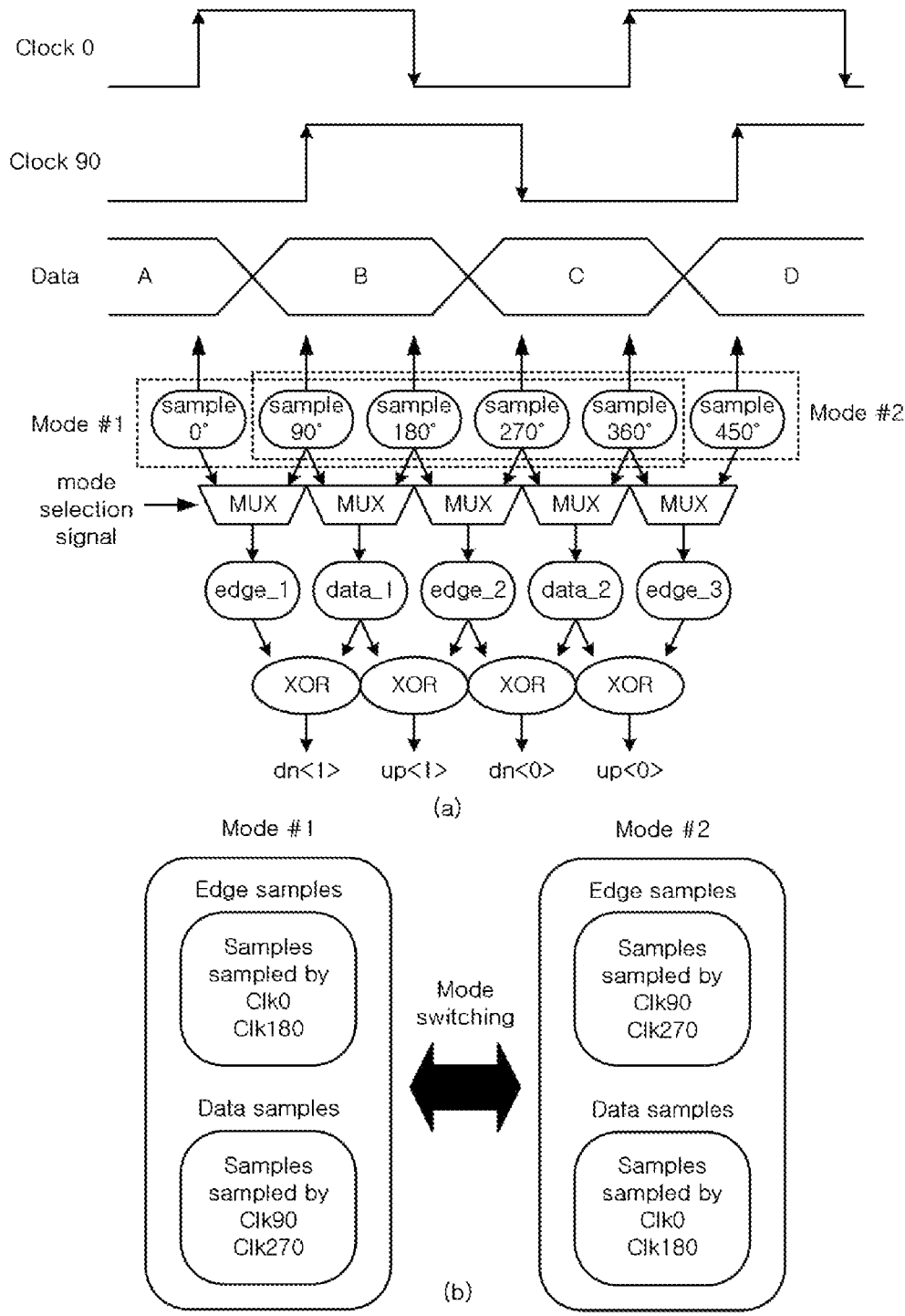
FIGS. 7(a) and 7(b) are views showing an operational principle of the Bang-Bang phase detector 100 according to an embodiment of the present invention.

FIGS. 7(a) and 7(b) are views showing an operational principle of the Bang-Bang phase detector according to the embodiment of the present invention. FIG. 7(a) shows clock signals and a data signal, sampling timings, and signals dn and up generated by performing XOR operations on the sampled signals, etc. FIG. 7(b) is a view conceptually showing a mode switching.

The Bang-Bang phase detector according to the embodiment of the present invention uses the half-rate structure to increase an operational bit rate of the overall system.

In addition, unlikely to the conventional Bang-Bang phase detector in which values sampled from 0° clock signal and 180° clock signal become edge samples, and values sampled from 90° clock signal and 270° clock signal become data samples, in the Bang-Bang phase detector according to the embodiment of the present invention, switching between the data sample and the edge sample may be performed by using multiplexers (MUX).

In other words, as shown in FIG. 7(b), the Bang-Bang phase detector includes a first mode in which edge samples are obtained from 0° clock signal and 180° clock signal, and data samples are obtained from 90° clock signal and 270° clock signal and a second mode in which the which edge samples are obtained from 90° clock signal and 270° clock signal and data samples are obtained from 0° clock signal and 180° clock signal, and switches (toggles) between the first mode and the second mode.

A phase difference between the clock signal and the data signal is moved by 180° (90° based on the clock period) based on the data period by using the mode switching.

Hereinafter, the data period is referred to a unit interval UI.

In addition, herein, the edge samples and data samples are the same in that the edge samples and data samples are obtained by sampling from the clock signal. However the edge samples are handled as samples that are obtained by sampling in edge areas or in nearby edge areas in which a transition occurs in the data signal, and the data samples are handled as samples that are obtained by sampling in areas between neighboring edges, or in middle areas of the data signal.

The phase detector 100 according to the embodiment of the present invention generates multiple samples (sample 0°, sample 90°, sample 180°, sample 270°, sample 360°, and sample 450°) by sampling the data signal in a time interval corresponding to a half of the unit interval UI based on the clock signal.

In addition, the phase detector 100 includes a first mode in which odd-numbered samples (sample 0°, sample 180°, and sample 360°) among the multiple samples are selected as the edge samples of the data signal and even-numbered samples (sample 90° and sample 270°) are selected as the data samples of the data signal to control the voltage-controlled delay line VCDL1, and a second mode in which the even-numbered samples (sample 90°, sample 270°, and sample 450°) among the multiple samples are selected as the edge samples of the data signal and the odd-numbered samples (sample 180° and sample 360°) are selected as the data samples of the data signal by using multiplexers MUX to control the voltage-controlled delay line VCDL1. The phase detector 100 operates by toggling between the first mode and the second mode according to a mode selection signal.

Meanwhile, a method of operating the phase detector will be described in another aspect.

The phase detector according to the embodiment of the present invention generates a first sample group (sample 0°, sample 180°, and sample 360°) by sampling the data signal in at least two positions by the unit interval UI based on the clock signal and a second sample group (sample 90°, sample 270°, and sample 450°) by sampling the data signal in at least two positions by the unit interval based on the clock signal, the second sample group being generated by sampling at positions where a half of the unit interval is different from the unit interval of the first sample group.

In addition, the phase detector includes a first mode that controls the voltage-controlled delay line VCDL1 by selecting the first sample group (sample 0°, sample 180°, and sample 360°) as edge samples of the data signal and by selecting the second sample group (sample 90°, sample 270°, and sample 450°) as data samples of the data signal, and a second mode that controls the voltage-controlled delay line VCDL1 by selecting the first sample group (sample 0°, sample 180°, and sample 360°) as the data samples of the data signal and by selecting the second sample group (sample 90°, sample 270°, and sample 450°) as the edge samples of the data signal. The phase detector operates by toggling between the first mode and the second mode according to the mode selection signal.

In addition, FIGS. 7(a) and (b) show that the first mode uses sample 0°, sample 90°, sample 180°, sample 270°, and sample 360° and the second modes uses sample 90°, sample 180°, sample 270°, sample 360°, and sample 450°. However, it will be understood by those skilled in the art that various forms are possible without being limited thereto. For example, a number of necessary samples may be reduced by only obtaining samples from signals dn<1> and up<1>.

In addition, the XOR gates perform XOR operations on the edge samples and the data samples that are adjacent to each other, and operation results are used for controlling the voltage-controlled delay line. In detail, the operation results are used for controlling the charge pumping unit 300 that supplies current for increasing or decreasing the control voltage $V_{ctrl1}$ of the voltage-controlled delay line VCDL1.

Signals dn<1> and dn<0> may become a signal do that controls the charge pumping unit 300 by having an AND operation performed thereon, or by being selected one of thereof. Signals up<1> and up<0> may become a signal upd that controls the charge pumping unit 300 by having an NAND operation performed thereon or by having an NOT operation performed on a selected one of thereof.

In addition, the mode selection signal is used for toggling between the first mode and the second mode. The signal for toggling between the two modes may be generated by the stuck detector 110 when a preset delay time exceeds a low limit while decreasing a delay of the voltage-controlled delay line VCDL1 or when the preset delay time exceeds a high limit while increasing a delay of the voltage-controlled delay line VCDL1.

Figure 8:
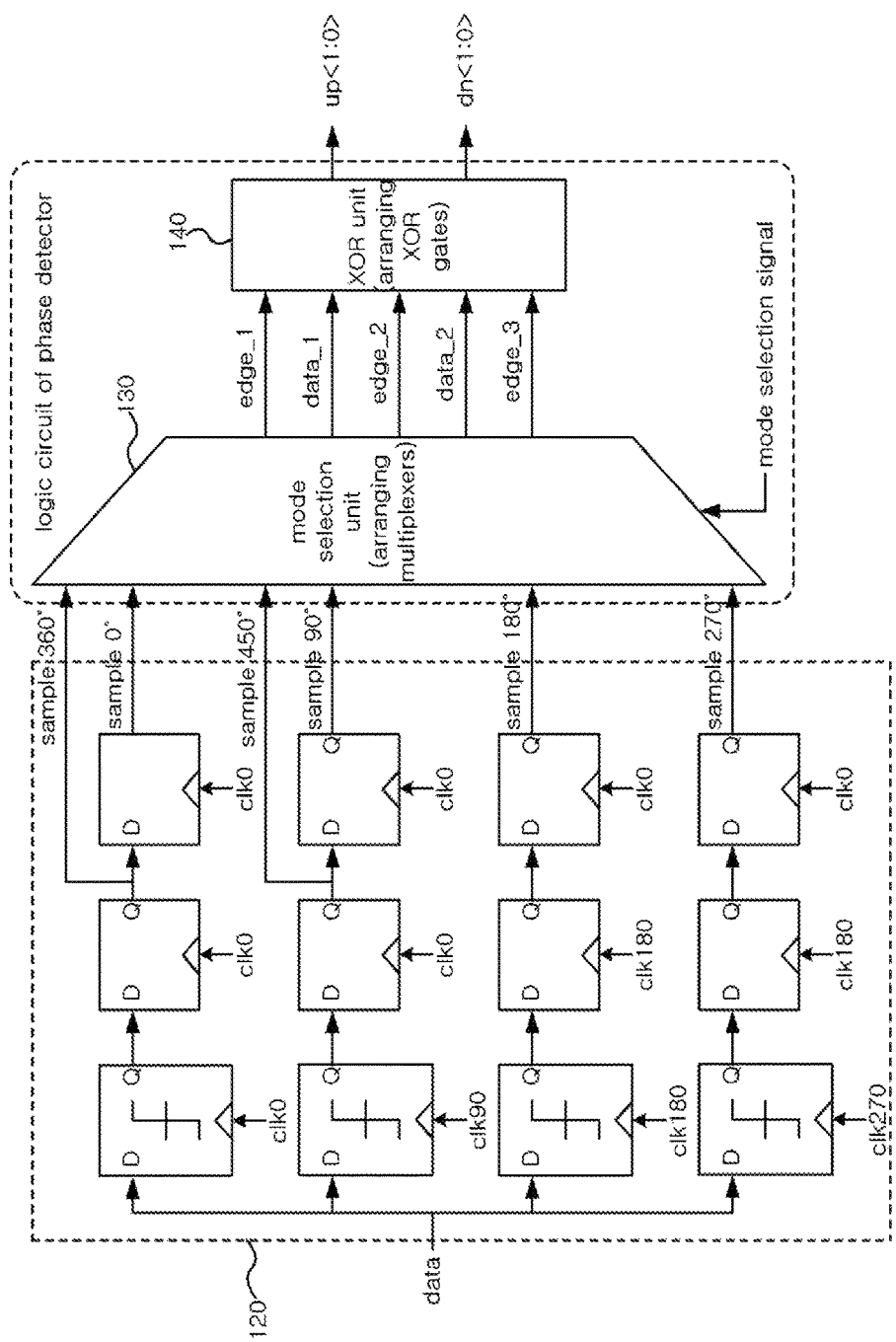
FIG. 8 is a view showing a configuration of a circuit diagram of the Bang-Bang phase detector 100, except for a stuck detector 110, according to the embodiment of the present invention.

FIG. 8 is a view showing a configuration of a circuit diagram of a Bang-Bang phase detector 100, except for a stuck detector 110, according to an embodiment of the present invention.

The Bang-Bang phase detector 100 according to an embodiment of the present invention receives clock signals and a data signal, and outputs a signal that is used for controlling the voltage-controlled delay line. In detail, the Bang-Bang phase detector 100 receives clock signals having four phases 0°, 90°, 180° and 270° and a data signal, and generates a signal used for controlling the charge pumping unit 300 that supplies current for increasing or decreasing the control voltage $V_{ctrl1}$ of the voltage-controlled delay line VCDL1.

The Bang-Bang phase detector 100 according to the embodiment of the present invention may be configured to include the stuck detector 110, the sampler unit 120, the mode selection unit 130, and the XOR unit 140 that are described above.

The sampler unit 120 samples the data signal based on the plurality of clock signals, and generates multiple samples (sample 0°~sample 450°) by sampling the data signal in a time interval corresponding to a half of a unit interval UI.

The mode selection unit 130 selects a series of samples among the multiple samples generated from the sampler unit 120 in such a way that the mode selection unit selects the series of samples that start from an odd-numbered sample, or selects the series of samples that start from an even-numbered sample, according to a mode selection signal.

The XOR unit 140 unit performs XOR operations on the samples among the series of samples that are adjacent to other and outputs an operation result. The output operation result of the XOR unit 140 is used for controlling the voltage-controlled delay line VCDL1.

Contrary to the conventional Bang-Bang phase detector, in the embodiment of the present invention, a multiplexer is provided between a flip-flop and an XOR gate such that switching between the data sample and the edge sample is performed.

A logic circuit of the phase detector including the mode selection unit 130 and the XOR unit 140 will be described in detail by using FIG. 9.

Figure 9:
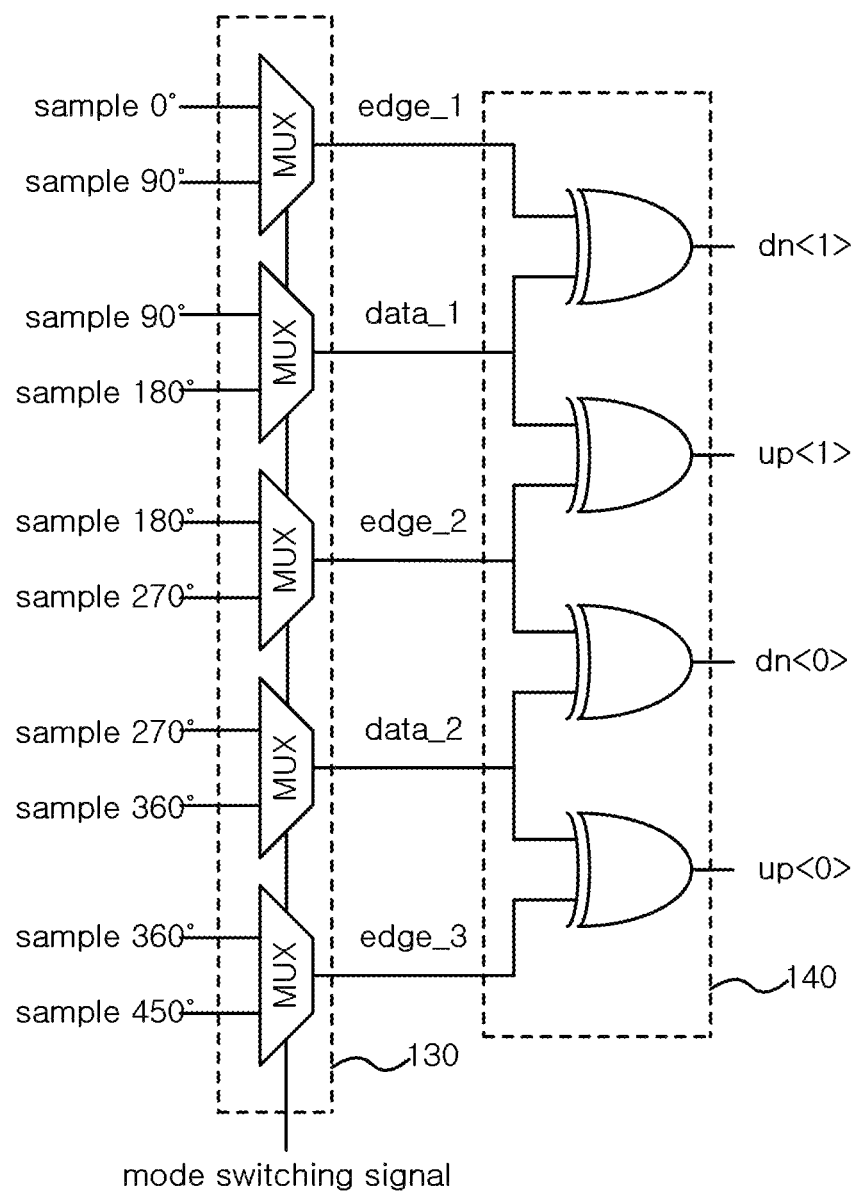
FIG. 9 is a configuration diagram of a logic circuit of the phase detector including a mode selection unit 130 and an XOR unit 140.

FIG. 9 is a configuration diagram of the logic circuit of the phase detector including the mode selection unit 130 and the XOR unit 140 according to an embodiment of the present invention.

The phase detector 100 including a mode switching function according to an embodiment of the present invention may be easily implemented by adding multiplexers between flip-flops and XOR gates of conventional phase detector.

The mode selection unit 130 is implemented by multiple multiplexers, for example, five multiplexers (MUX). The mode selection unit 130 selects a series of samples that start from an odd-numbered sample (sample 0°), or selects a series of samples that start from an even-numbered sample (sample 90°).

In addition, the XOR unit 140 performs an XOR operation on the samples that are adjacent to each other and output from the mode selection unit 130, and outputs signals such as dn<1>, up<1>, dn<0> and up<0> that are used for controlling the charge pump.

Hereinafter, a method of operating the Bang-Bang phase detector 100 according to the embodiment of the present invention will be described.

First, the sampler unit 120 of the phase detector 100 samples the data signal based on four clock signals clk0, clk90, clk180, and clk270, and generates multiple samples (sample 0°, sample 90°, sample 180°, sample 270°, sample 360°, and sample 450°) having time intervals corresponding to a half of the unit interval UI.

Then, the mode selection unit 130 of the phase detector 100 selects a series of samples among the multiple samples generated by the sampler unit 120. However, the mode selection unit 130 selects the series of samples that starts with an odd numbered sample (sample 0°), or selects the series of samples that starts with an even numbered sample (sample 90°) according to a mode selection signal. When a stuck state is detected by the stuck detector, the mode selection signal is toggled, and switching between the edge sample and the data sample is performed.

Then, the XOR unit 140 of the phase detector 100 outputs signals up<1:0> and dn<1:0> by performing XOR operations on the samples that are adjacent to each other and output from the mode selection unit 130. The output signals are used for controlling the voltage-controlled delay line VCDL1 of the delay-locked loop as it is or by performing a logical operation thereon. In detail, the output signals are used for controlling the charge pumping unit 300 that configures the delay-locked loop.

Figure 10:
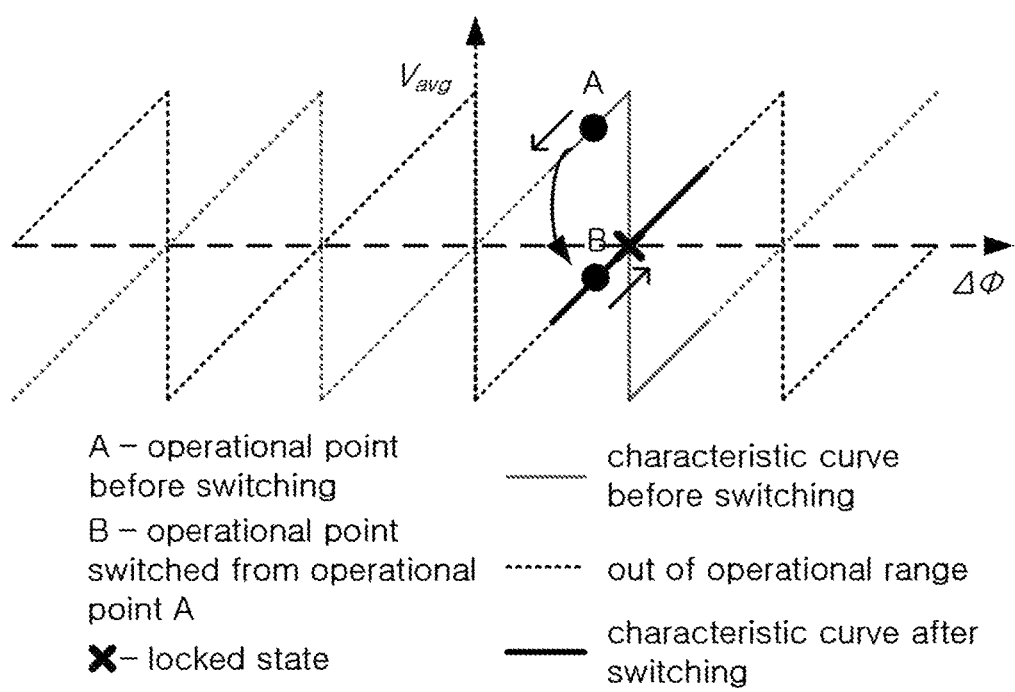
FIG. 10 is a conceptual diagram of a method of data-edge switching according to the delayed-lock loop of the embodiment of the present invention and a receiver based thereon.

FIG. 10 is a conceptual diagram of a method of data-edge switching according to the delayed-lock loop of the embodiment of the present invention and a receiver based thereon.

The graph shown in FIG. 10 shows a relation between a phase difference ΔΦ between a data signal and a clock signal that is delayed by a voltage-controlled delay line and a relation between a signal do output from the phase detector and an average $V_{avg}$ of a signal upb. In FIG. 10, an operational point A that is before data-edge switching is moved to decrease the phase difference ΔΦ between the data signal and the clock signal, but the stuck locking may not be prevented. However, an operational point B that is after data-edge switching, may efficiently be transited to a locked state.

When a voltage-controlled delay line that has a delay time range corresponding to a half of a unit interval (0.5 UI) of a data period is used in the conventional delay-locked loop, a phase difference between a data signal and a clock signal may be all values between 0 and 1 UI. Thus, even though initial conditions are set well, the voltage-controlled delay line may not provide an adequate delay time in half of the total cases.

Herein, stuck locking occurs, in which the voltage-controlled delay line is fixed in a state having the longest delay time or the shortest delay time that the voltage control delay line can have, by situations such as increasing the delay time where the delay can no longer be increased, or vice versa.

However, the data sample and the edge sample of the Bang-Bang phase detector have a phase difference of 0.5 UI, thus the method of switching between the data sample and the edge sample according to the present invention has an effect in that the delay time is moved by 0.5 UI in parallel. Therefore, when the stuck locking occurs, an adequate delay time may be provided by switching between the data sample and the edge sample. In addition, a stuck locking problem is solved since the delay-locked loop is operated at that point.

Figure 11:
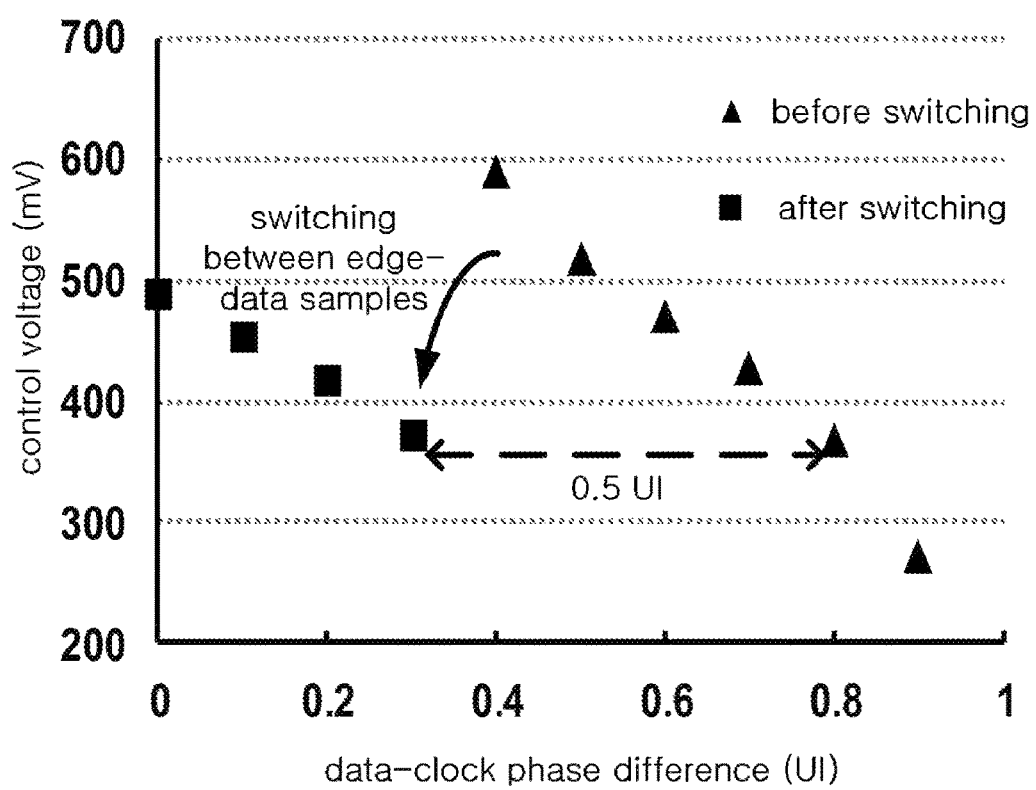
FIG. 11 is a graph showing values of control voltages $V_{ctrl1}$ that are sensed from a voltage-controlled delay line according to a data-clock phase difference received by the delay-locked loop and the receiver based on the delayed-locked loop according to the embodiment of the present invention.

FIG. 11 is a graph showing values of the control voltages $V_{ctrl1}$ that are sensed from the voltage-controlled delay line according to a data-clock phase difference received by the receiver based on the delay-locked loop according to the embodiment of the present invention and a forwarded clock receiver based thereon.

Within an area where the phase difference between the received data signal and the clock signal is large, a relation between the phase difference and the control voltage $V_{ctrl1}$ shows a similar aspect to the characteristic curves of FIGS. 2 and 3. However, when the phase difference becomes below a certain level, the voltage-controlled delay line is operated in a lower control voltage since data-edge switching is performed.

According to the embodiment of the present invention, the data samples and the edge samples are switched even though the voltage-controlled delay line has a phase range smaller than 1 unit interval UI within a possible control voltage range. Thus, the voltage-controlled delay line provides adequate delay time for a phase difference of all ranges.

Hereinafter, effects according to one aspect of the present invention will be described.

In the conventional delay-locked loop and the forwarded clock receiver based on the delayed-locked loop, the voltage-controlled delay line has to include a point at which a phase difference between the clock signal and the data signal becomes 0 degrees, thus a variable range of a delay time that is equal to or greater than 1 UI is required. In addition, even though the delay time has the variable range that exceeds 1 UI, the conventional delay-locked loop is not free from the stuck locking, and additional circuitry is needed to solve the stuck locking.

In contrast, according to one aspect of the present invention, the stuck state is solved and even though a point in which a phase difference becomes 0 degree is not included by the variable range of the delay time being 0.5 UI, the above problem is solved by using the method of data-edge switching (mode switching). According to another aspect of the present invention, stuck locking is fundamentally solved and a delay time range that is conventionally required is decreased by half.

Therefore, according to another aspect of the present invention, the delay-locked loop and the forwarded clock receiver based on the delayed-locked loop are capable of providing the voltage-controlled delay line that consumes large power and occupies a large area within a chip, whereby power consumption and an occupying area thereof are reduced. In particular, when the delay-locked loop is respectively used for data channels of a parallel forwarded data structure in which data is transmitted by using multiple channels, the above advantages of reduced power consumption and occupying area are further enhanced.

In addition, in the conventional receiver based on an oscillator, a frequency range of jitter tolerance is limited, or the range may greatly vary to an unpredictable level depending on the situation. However, according to another aspect of the present invention, the receiver may be designed to consume low power while using the delay-locked loop and without using the oscillator, thus the receiver has improved jitter tolerance.

What is claimed is:

1. A delay-locked loop comprising:
   a voltage-controlled delay line generating a clock signal; and
   a phase detector obtaining a first sample group by sampling a data signal in at least two positions at a unit interval based on the clock signal and a second sample group by sampling the data signal in at least two positions at the unit interval based on the clock signal, wherein a difference between the positions in which the second sample group is obtained and the positions in which the first sample group is obtained is a half of the unit interval,
   selecting, for a first mode, the first sample group as an edge sample of the data signal and the second sample group as a data sample of the data signal, and for a second mode, the first sample group as the data sample of the data signal and the second sample group as the edge sample of the data signal, and
   controlling the voltage-controlled delay line by toggling between the first mode and the second mode.

2. A forwarded clock receiver based on a delay-locked loop, the forwarded clock receiver comprising:
   the delay-locked loop of claim 1,
   wherein a received clock signal is input to the voltage-controlled delay line.

3. The delay-locked loop of claim 1, wherein the phase detector further performs an XOR operation on the edge sample of the data signal and the data sample of the data signal that are adjacent to each other for controlling the voltage-controlled delay line.

4. The delay-locked loop of claim 1, wherein when a preset delay time exceeds a low limit while decreasing a delay of the voltage-controlled delay line, or when the preset delay time exceeds a high limit while increasing a delay of the voltage-controlled delay line, the phase detector toggles between the first mode and the second mode.

5. A delay-locked loop comprising:
   a first voltage-controlled delay line generating a first clock signal; and
   a phase detector including:
      a sampler generating a series of samples by sampling a data signal at time intervals corresponding to a half of a unit interval based on the first clock signal;

a mode selector selecting every odd-numbered samples among the series of samples generated from the sampler or every even-numbered samples among the series of samples generated from the sampler, according to a mode selection signal; and an XOR operator performing an XOR operation on samples adjacent to each other among the selected samples, and outputting an operation result for controlling the first voltage-controlled delay line.

6. The delay-locked loop of claim 5, wherein the phase detector further includes:

a struck detector toggling the mode selection signal when a control voltage for the first voltage-controlled delay line exceeds a high limit while increasing the control voltage, or when the control voltage exceeds a low limit while decreasing the control voltage.

7. The delay-locked loop of claim 5, further comprising:
a pair of charge pump increasing or decreasing a control voltage of the first voltage-controlled delay line by using the output result of the XOR operator; and
a loop filler filtering the control voltage.

8. The delay-locked loop of claim 5, further comprising:
a quadrature phase clock generator generating a second clock signal that is delayed by 90 degrees from the first clock signal output from the first voltage-controlled delay line and providing the second clock signal to the sampler so as to be used for generating the samples.

9. The delay-locked loop of claim 8, wherein the quadrature phase clock generator includes:

a second voltage-controlled delay line generating the second clock signal by delaying the first clock signal;

a voltage increasing charge pump supplying a current that increases a control voltage that controls a delay of the second voltage-controlled delay line;

a voltage decreasing charge pump supplying a current that decreases the control voltage; and a second phase detector controlling the voltage increasing charge pump and the voltage decreasing charge pump.

10. The delay-locked loop of claim 9, wherein the second phase detector controls the voltage decreasing charge pump by using a second division signal that is obtained by dividing the second clock signal, and controls the voltage increasing charge pump by using a signal obtained by performing an NOR operation on the second division signal and a first division signal that is obtained by dividing the first clock signal.

11. A quadrature phase clock generator, the generator comprising:

a voltage-controlled delay line generating a second clock signal that is generated by delaying an input first clock signal;

a voltage increasing charge pump supplying a current that increases a control voltage that controls a delay of the voltage-controlled delay line;

a voltage decreasing charge pump supplying a current that decreases the control voltage; and a phase detector controlling the voltage increasing charge pump and the voltage decreasing charge pump, wherein the phase detector controls:

the voltage decreasing charge pump by using a second division signal that is obtained by dividing the second clock signal, and the voltage increasing charge pump by using a signal obtained by performing an NOR operation on the second division signal and a first division signal that is obtained by dividing the first clock signal.

12. The quadrature phase clock generator of claim 11, wherein a ratio between a current supply capacity of the voltage increasing charge pump and a current supply capacity of the voltage decreasing charge pump is set to 4:5.

13. A method of operating a phase detector, wherein the phase detector is used in a delay-locked loop and includes a sampler, a mode selector and an XOR operator, the method comprising:

sampling, by the sampler, a data signal at time intervals corresponding to a half of a unit interval based on a clock signal for obtaining a series of samples;

selecting, by the mode selector, every odd-numbered samples among the series of samples obtained by the sampler, or every even-numbered samples among the series of the samples obtained by the sampler, according to a mode selection signal; and performing, by the XOR operator, an XOR operation on adjacent samples among the samples selected by the mode selector, and outputting an operation result; and wherein the operation result is used for controlling a voltage-controlled delay line of the delay-locked loop.

14. The method of claim 13, wherein the mode selection signal is toggled when a control voltage for the voltage-controlled delay line exceeds a high limit while increasing the control voltage, or when the control voltage exceeds a low limit while decreasing the control voltage.

15. A delay-locked loop comprising:
a voltage-controlled delay line generating a clock signal; and a phase detector obtaining a series of samples by sampling a data signal at time intervals corresponding to a half of a unit interval based on the clock signal, selecting, for a first mode, every odd-numbered samples among the series of samples as an edge sample of the data signal and every even-numbered samples among the series of samples as a data sample of the data signal, selecting, for a second mode, said every odd-numbered samples among the series of samples as the data sample of the data signal and said every even-numbered samples among the series of samples as the edge sample of the data signal, and controlling the voltage-controlled delay line by toggling between the first mode and the second mode.

16. The delay-locked loop of claim 15, wherein the phase detector further performs an XOR operation on the edge sample of the data signal and the data sample of the data signal that are adjacent to each other are used for controlling the voltage-controlled delay line.

17. The delay-locked loop of claim 15, wherein when a preset delay time exceeds a low limit while decreasing a delay of the voltage-controlled delay line, or when the preset delay time exceeds a high limit while increasing a delay of the voltage-controlled delay line, the phase detector toggles between the first mode and the second mode.

18. A forwarded clock receiver based on a delay-locked loop, the forwarded clock receiver comprising:

the delay-locked loop of claim 15, wherein a received clock signal is input to the voltage-controlled delay line.

* * * * *